(12) United States Patent
Nakajima et al.

(10) Patent No.: US 6,475,820 B2
(45) Date of Patent: Nov. 5, 2002

(54) METHOD FOR GROWING SEMICONDUCTOR LAYER AND METHOD FOR FABRICATING SEMICONDUCTOR LIGHT EMITTING ELEMENTS

(75) Inventors: Hiroshi Nakajima, Kanagawa; Shigeki Hashimoto, Tokyo; Tsunenori Asatsuma, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/882,145

(22) Filed: Jun. 15, 2001

(65) Prior Publication Data

US 2002/0052060 A1 May 2, 2002

(30) Foreign Application Priority Data

Jun. 16, 2000 (JP) ........................................ 2000-182037

(51) Int. Cl.$^7$ ............................................... H01L 21/00
(52) U.S. Cl. ....................................................... 438/46
(58) Field of Search ........................ 438/40, 39, 41–47, 438/800, 604–606

(56) References Cited

U.S. PATENT DOCUMENTS 5,128,276 A * 7/1992 Ambrosius et al. ........... 372/46

OTHER PUBLICATIONS

"Ranges of Deposition Temperatures Applicable for Metalorganic Vapor Phase Epitaxy of Gan Films Via the Technique of Pendeo–Epitaxy", D. B. Thomson, et al, MRS Internet J. Nitride Semicond. Res. 4S1, G3.37 (1999).

"Pendeo–Epitaxy: A New Approach for Lateral Growth of Gallium Nitide Films", T. S. Zheleva et al; Journal of Electronic Materials vol. 28, No. 4 (1999).

"Pendeoepitaxy of Gallium Nitride Thin Films", K. Linthicum et al, Applied. Physics. Letters. vol. 75, No. 2(1999).

"Process Routes for Low Defect–Density Gan on Various Substrates Employing Pendeo–Epitaxial Growth Techniques", K. J. Linthicum et al, MRS Internet J. Nitride Semicond. Res. 4S1, G4.9 (1999).

"Pendeo–Epitaxy of Gallium Nitride and Aluminum Nitride Films and Heterostructures on Silicon Carbide Substrate", T. Gehrke, et al, MRS Internet J. Semicond. Res. 4S1, G3.2 (1999).

"Dislocation Reduction in GaN Thin Films Via Lateral Overgrowth from Trenches", Y. Chen et al, Applied Physics Letters, vol. 75, No. 14, (Oct. 4, 1999).

"Lateral Epitaxy of Low Defect Density GaN layers Via Organomettallic Vapor Phase Epitaxy", O. Nam et al, Applied Physics Letters, vol. 71, No. 18 (Nov. 3, 1997).

"Pendeo–Epitaxy—A New Approach For Lateral Growth of Gallium Nitride Structures", T. S. Zheleva et al, MRS Internet J. Nitride Semicond. Res. 4S1, G3.38 (1999).

Dislocation Density Reduction Via Lateral Epitaxy in Selectively Grown GaN Structures; T. S. .Zheleva, et al, Applied Physics Letters. vol. 71, No. 2472 (1997).

Pendeo–Epitaxial Growth and Characteristics of GaN and Related Materials on 6H–SiC(0001) and Si(111) Subsrates; R. F. Davis, et al; MRS Internet J. Nitride Semicond. Res.5S1, W2.1 (1999).

* cited by examiner

*Primary Examiner*—Craig Thompson
(74) *Attorney, Agent, or Firm*—Sonnenschein, Nath & Rosenthal (57) ABSTRACT

The present invention provides a method for growing a semiconductor layer by which the size of generable voids is controllable, inclination of the c-axis of the semiconductor crystal is avoidable and the defects in the semiconductor layer is reducible, in which a first semiconductor layer typically made of GaN is formed in a ridge pattern on a substrate, and a second semiconductor layer typically comprising GaN is then formed on the first semiconductor layer under a condition by which the growth rate in the direction parallel to the major plane of the substrate is larger than that in the direction perpendicular thereto, which is attainable by controlling the pressure in a reaction chamber in which the vapor-phase growth proceeds at 53,200 Pa (400 Torr) or above, to allow the side planes of the second semiconductor layer incline at an acute angle to the bottom plane thereof.

8 Claims, 9 Drawing Sheets

METHOD FOR GROWING SEMICONDUCTOR LAYER AND METHOD FOR FABRICATING SEMICONDUCTOR LIGHT EMITTING ELEMENTS

CROSS REFERENCES TO RELATED APPLICATIONS

The present document is based on Japanese Priority Document JP 2000-182037, filed in the Japanese Patent Office on Jun. 16, 2000, the entire contents of which being incorporated herein by reference.

BACKGROUND OF THE INVENTION

1. Field of the Invention

The present invention relates to a method for growing a semiconductor layer made of a nitrogen-containing (also referred to as "nitride-base" hereinafter) III–V group compound, and a method for fabricating semiconductor light emitting elements using such method for growing a semiconductor layer.

2. Description of the Related Art

Nitride-base III–V group compound semiconductor typified by gallium nitride (GaN) (also referred to as "GaN-base semiconductor" hereinafter) is a promising material for a light emitting element capable of emitting light in a green to blue spectral region, and even in a ultraviolet region.

In particular, such GaN-base semiconductor has attracted a great deal of attention since a light emitting diode (LED) using thereof was put into practical use. A semiconductor laser using such GaN-base semiconductor has also been reported as successful, and is expected to be applied to an optical pick-up of a device (also referred to as an optical disk device) such as a DVD (digital versatile disk) such that performing read (reproduction) or write (recording) operation to or from an optical recording medium (also referred to as an optical disk) which optically stores information.

Figure 4:
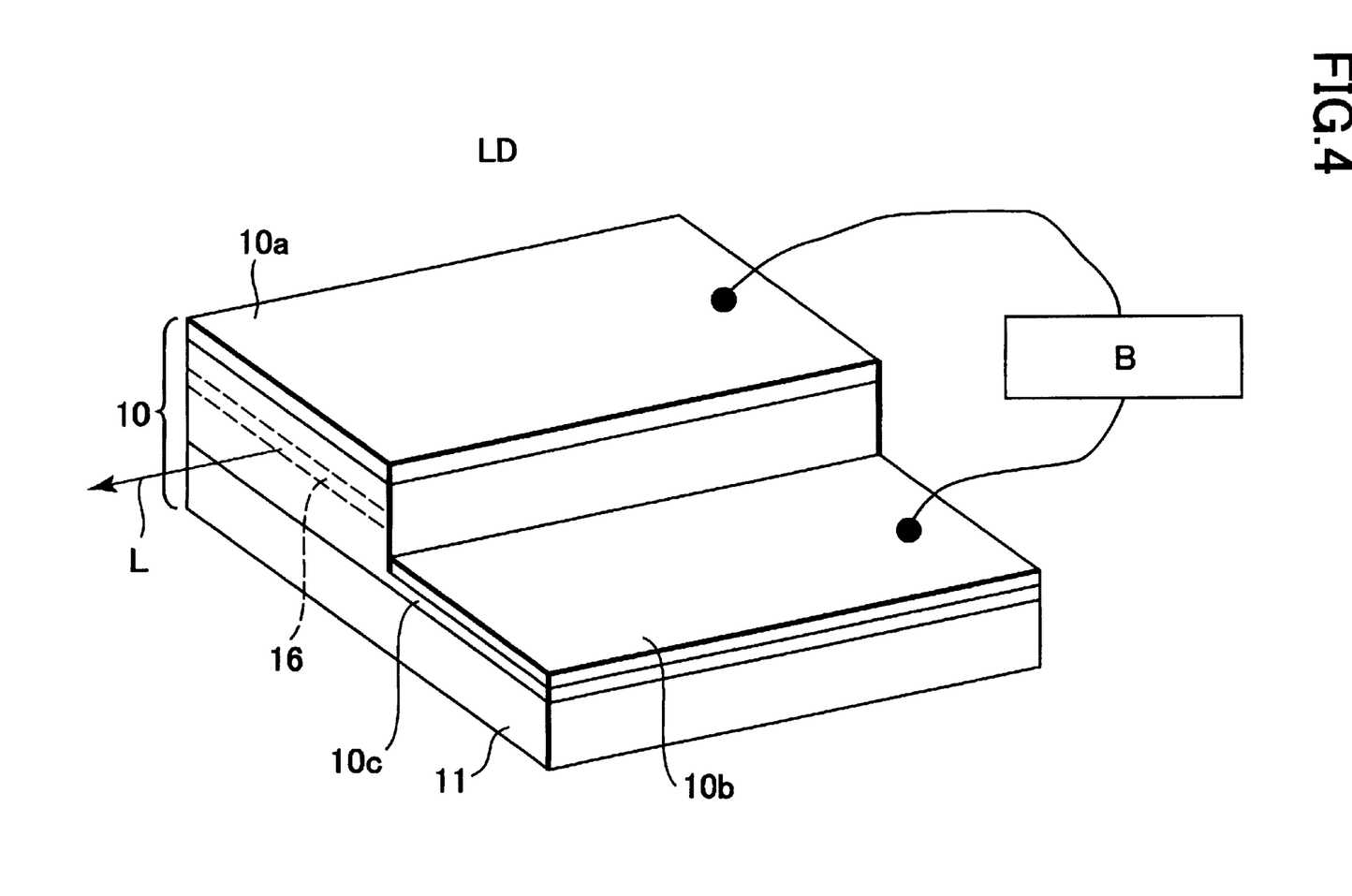
FIG. 4 is a schematic perspective view of a semiconductor light emitting element of the present invention and the prior art.

FIG. 4 is a perspective view showing such GaN-base semiconductor light emitting element (laser diode LD) having a general constitution fabricated on a sapphire substrate.

On a sapphire substrate 11, a GaN-base semiconductor layer which includes an active layer 16 having a multiple quantum well structure is stacked, all of which compose a semiconductor stack 10.

In such semiconductor stack 10, a p-type cladding layer and an n-type cladding layer are formed so as to sandwich the active layer 16, where a p-electrode 10a and an n-electrode 10b are formed so as to be respectively connected to such cladding layers. Since the sapphire substrate 11 is an insulating material, a semiconductor layer which is connected to the n-type cladding layer or an extended portion 10c of such n-type cladding layer per se is formed on the sapphire substrate 11 so as to projected out from the semiconductor stack 10, and further thereon such n-electrode 10b is formed.

When a predetermined voltage is applied from a power source B between such p-electrode 10a and the n-electrode 10b, the active layer 16 within the semiconductor stack 10 emits laser light L.

Figure 5A:
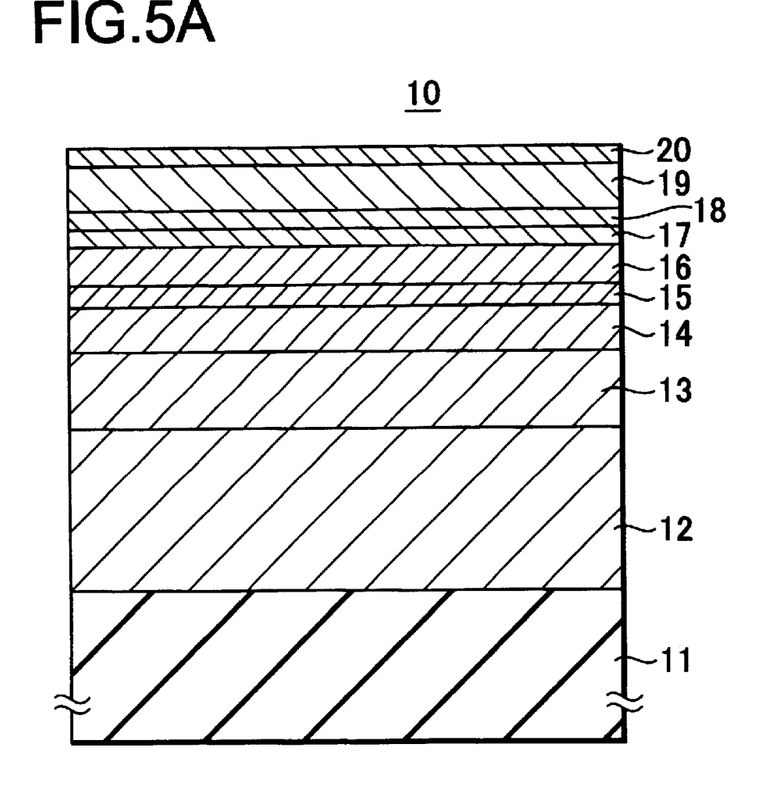
FIG. 5A is a schematic sectional view showing a semiconductor stack portion of the semiconductor light emitting element shown in FIG. 4.

FIG. 5A is a sectional view showing in more detail a portion of the foregoing semiconductor stack 10.

In such constitution, a buffer layer 12 typically made of GaN is formed on the sapphire substrate 11, and further thereon an n-type GaN layer (contact layer) 13 of approx. 5.0 $\mu$m thick, an n-type AlGaN layer (cladding layer) 14 of approx. 0.5 $\mu$m thick, an n-type GaN layer (guide layer) 15 of approx. 0.1 $\mu$m thick, the active layer (light emitting layer) 16 having a multiple quantum well (MQW) structure typically made of GaInN, a p-type AlGaN layer (cap layer) 17 of approx. 0.02 $\mu$m, a p-type GaN layer (guide layer) 18 of approx. 0.1 $\mu$m thick, a p-type AlGaN layer (cladding layer) 19 of approx 0.5 $\mu$m thick, and a p-type GaN layer (contact layer) 20 of approx. 0.1 $\mu$m thick are stacked in this order.

As for the layers described in the above, an n-type impurity (donor impurity) to be doped into the n-type layers can be silicon (Si) or the like, and a p-type impurity (acceptor impurity) to be doped into the p-type layers can be magnesium (Mg), zinc (Zn) or the like.

Figure 5B:
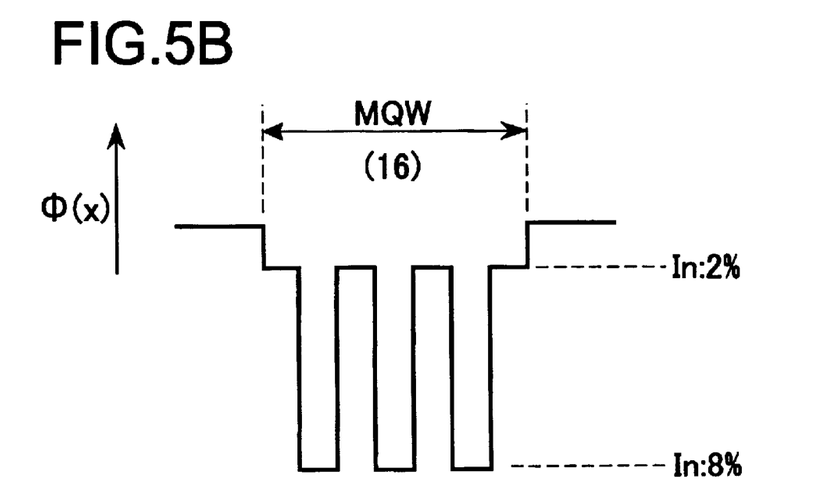
FIG. 5B is a potential diagram of the active layer thereof.

FIG. 5B is a schematic view showing a potential profile of such active layer 16 having a multiple quantum well structure.

Such quantum well structure is attained by a constitution of the active layer 16 in which layers individually having an indium (In) content of 2% and 8%, which differ in the potential, are alternatively stacked with each other.

A method for fabricating such GaN-base semiconductor light emitting element (laser diode LD) will be explained.

Fabrication of a light emitting element or the like using the GaN-base semiconductor requires such GaN-base semiconductor to be grown on a substrate made of sapphire, SiC or the like in a multi-layered manner. Typical methods for growing the GaN-base semiconductor include the metal-organic chemical vapor deposition (MOCVD) process and the molecular beam epitaxy (MBE) process, where the former is advantageous on the practical basis and is widely used since it does not require a high degree of vacuum.

In the above-mentioned MOCVD process, a substrate to be processed is placed in an MOCVD reaction chamber (reactor) typically made of quartz glass, to which ammonia ($NH_3$) as a nitrogen source and other source materials such as gallium (Ga), aluminum (Al) and indium (In) depending on a GaN-base semiconductor to be grown are supplied together with a carrier gas, while being heated by, for example, an RF coil surrounding such reaction chamber, to thereby grow the GaN-base semiconductor on such target substrate housed in the reaction chamber.

A method for growing the multiple GaN-base semiconductor layers whose constitution is shown in FIG. 5A will be explained referring to FIGS. 6A and 6B.

Figure 6A:
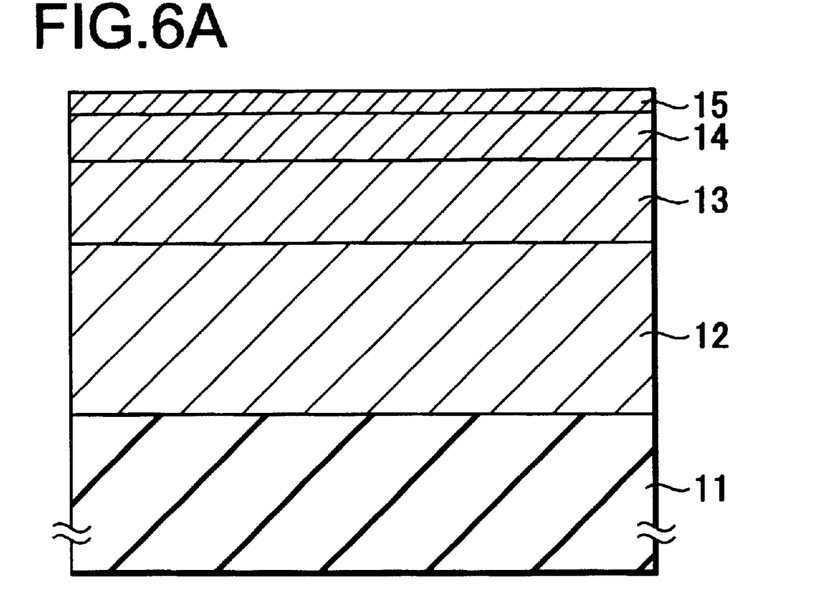

As shown in FIG. 6A, the sapphire substrate 11 having the c-plane exposed on the surface thereof is subjected to thermal cleaning, and further thereon the buffer layer 12 typically made of GaN, the n-type GaN layer (contact layer) 13 of approx. 5.0 $\mu$m thick, the n-type AlGaN layer (cladding layer) 14 of approx. 0.5 $\mu$m thick and the n-type GaN layer (guide layer) 15 of approx. 0.1 $\mu$m thick are stacked by crystal growth in this order.

An n-type impurity (donor impurity) available for the doping into the foregoing n-type layers in the above process is represented by silicon (Si).

Figure 6B:
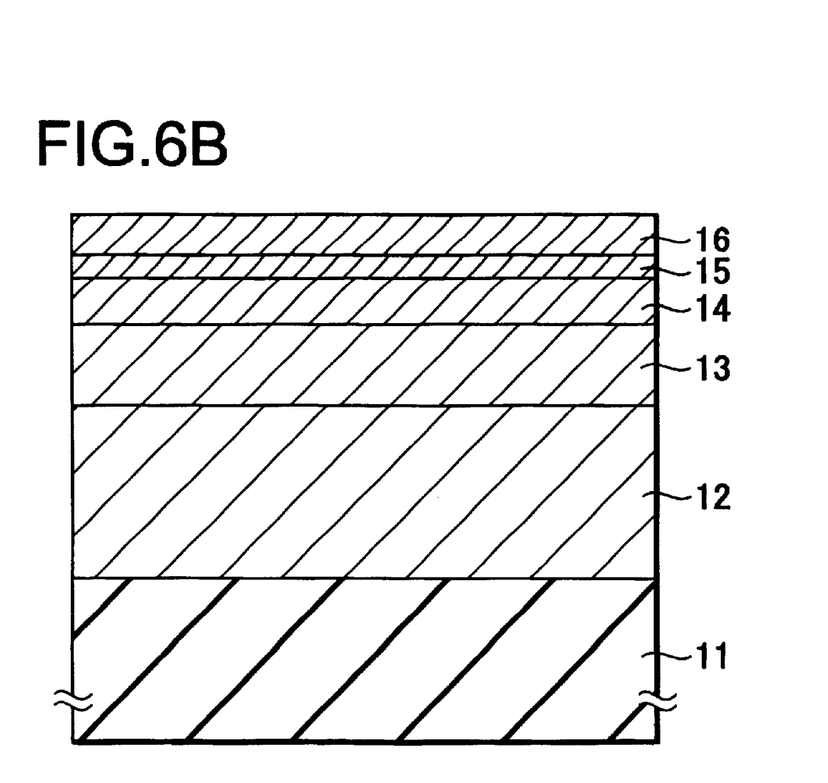

Next, as shown in FIG. 6B, the active layer (light emitting layer) 16 having a multiple quantum well (MQW) structure made of GaInN is formed through crystal growth by the MOCVD process on the n-type GaN layer 15.

The p-type AlGaN layer (cap layer) 17 of approx. 0.02 $\mu$m, the p-type GaN layer (guide layer) 18 of approx. 0.1 $\mu$m thick, the p-type AlGaN layer (cladding layer) 19 of approx. 0.5 $\mu$m thick, and the p-type GaN layer (contact layer) 20 of approx. 0.1 µm thick are then formed on the active layer 16 in this order through crystal growth by the MOCVD process, to thereby obtain a structure shown in FIG. 5A.

The p-Type impurities (acceptor impurity) available for the doping into the foregoing p-type layers in the above process include magnesium (Mg) and zinc (Zn).

In the successive process steps, the extended portion 10c of the n-type cladding layer as shown in FIG. 4 is formed by etching, electrodes 10a, 10b are formed, and end planes for allowing laser oscillation are formed for example by etching, to thereby obtain a desired laser diode.

Such laser diode LD is produced by a crystal growth method such as the MOCVD process, and thus generally employs a sapphire substrate.

There is, however, a large lattice mismatch between the sapphire substrate and the GaN layer, which results in a large number of threading dislocation introduced into the semiconductor stack composed of the GaN layers, and ruins reliability of the obtained element.

A method for obtaining a high-quality crystal area with less threading dislocation has thus been proposed in which a GaN layer of approx. 1 to 3 µm thick (typically 2 µm) is grown on the sapphire substrate, etching the GaN layer so as to leave such GaN layer on the sapphire substrate projected in a ridge form, and a new GaN layer is laterally grown from the side planes of the individual ridges, to thereby deflect and converge the threading dislocation.

Such growth method for the semiconductor layer will be explained referring to the drawings.

Figure 7A:
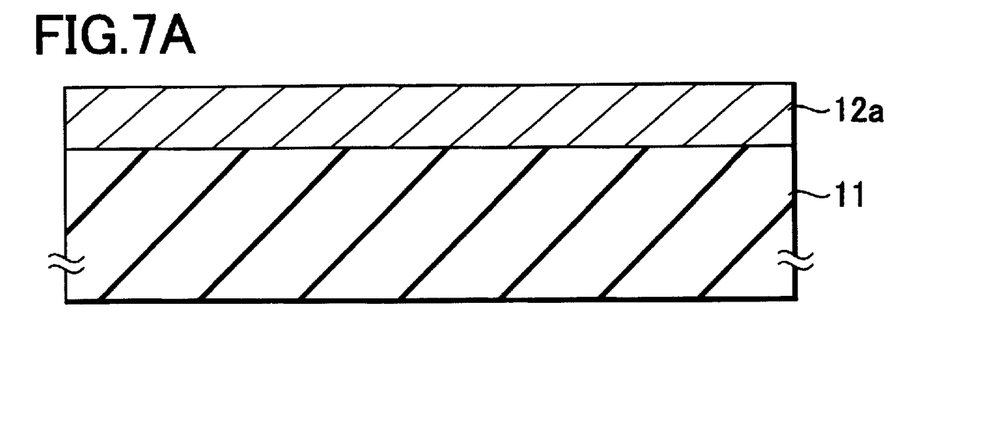

First as shown in FIG. 7A, the c-plane of the sapphire substrate 11 is subjected to thermal cleaning, and a GaN layer of approx. 1 to 3 µm thick (typically 2 µm) is grown by the MOCVD process to thereby form a first semiconductor layer 12a.

Figure 7B:
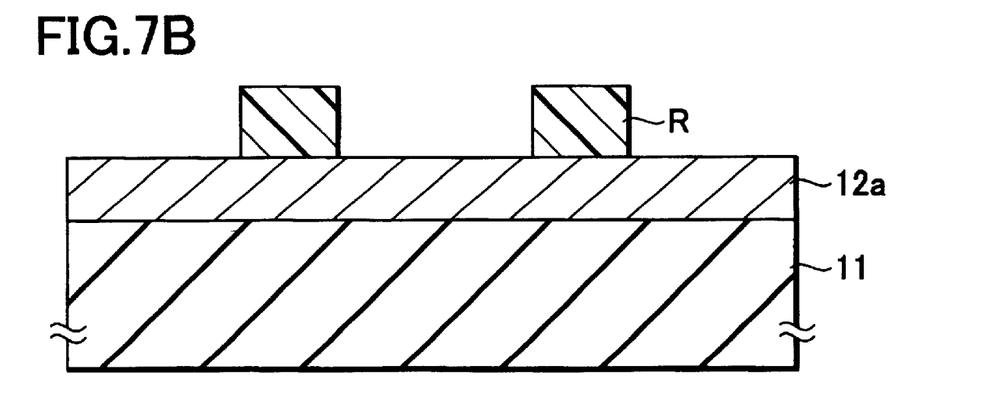

Next, a photosensitive resin is coated on the entire surface of the first semiconductor layer 12a, and such coated film is then patterned by photolithographic processes such as light exposure and development to thereby form a resist film R on the first semiconductor layer 12a for protecting thereof selectively in a region to be remained, as shown in FIG. 7B.

Figure 7C:
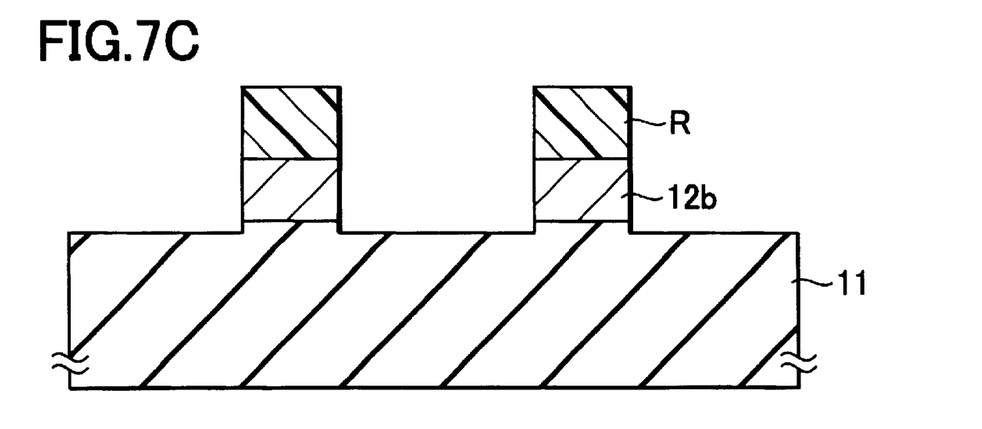

Next, as shown in FIG. 7C, the first semiconductor layer 12a is etched while being masked with the resist film R, to thereby form first semiconductor layers 12b projected in a ridge form on the sapphire substrate 11.

Each first semiconductor layer 12b is 1 to 3 µm high and 3 µm wide, and such ridge-formed first semiconductor layers 12b are repetitively formed over the entire surface of the sapphire substrate 11 with 10-µm intervals.

Thereafter the etching is further proceeded to lower the surface level of the sapphire substrate 11 so that such sapphire substrate 11 will be projected in portions where the first semiconductor layers 12b are formed.

Figure 8A:
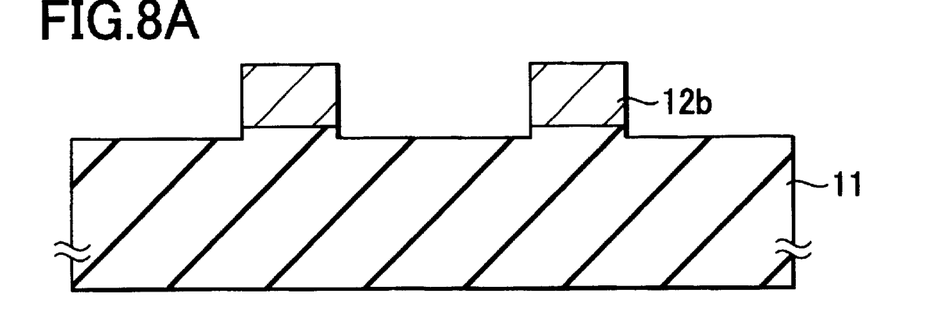
Figure 8B:
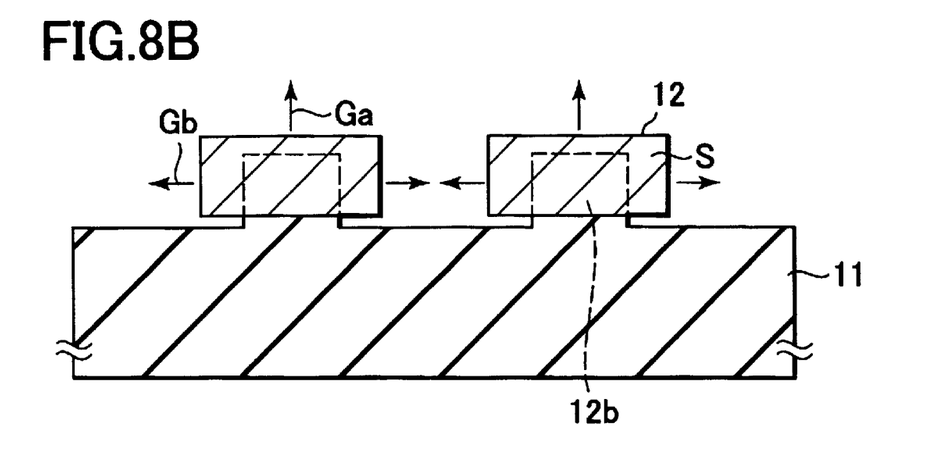

Next, the resist film R is removed typically by ashing as shown in FIG. 8A, and on the surface of the first semiconductor layers 12b a second semiconductor layer 12 again comprising GaN similarly to the first semiconductor layers 12b is grown in vapor phase under a condition by which a growth rate $G_b$ in a direction parallel to a major plane of the sapphire substrate 11 is larger than a growth rate $G_a$ in a direction perpendicular thereto.

In such process, the pressure in a reaction chamber in which the vapor phase growth proceeds is controlled at 26,600 Pa (200 Torr) or around. Such control allows a (11–20) plane to appear on the side plane S of the second semiconductor layer 12, which is perpendicular to the bottom plane of the second semiconductor layer 12.

Figure 8C:
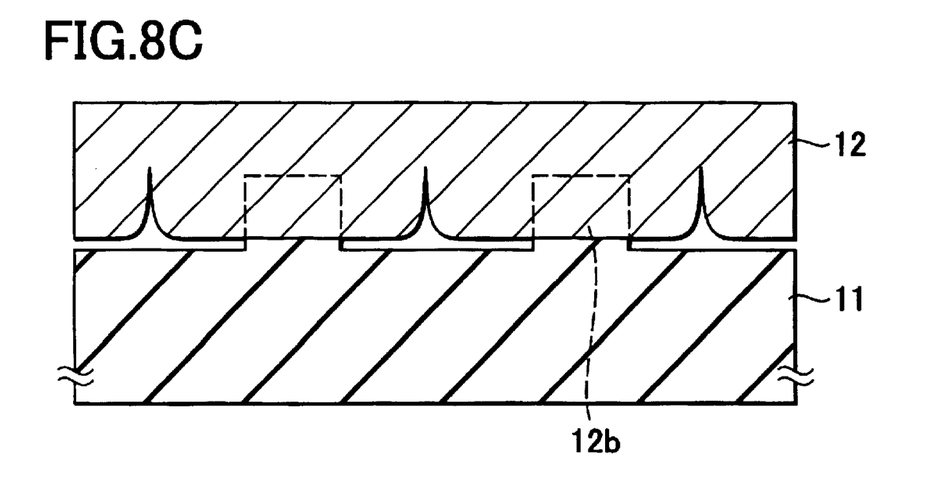

Continuing such vapor-phase growth of the second semiconductor layer 12 will result in fusion of the portions of the second semiconductor layer 12 individually grown from the surface of the adjacent first semiconductor layers 12b, and thereafter only the growth in the direction perpendicular to the major plane of the sapphire substrate 11 will continue, as shown in FIG. 8C.

Figure 9A:
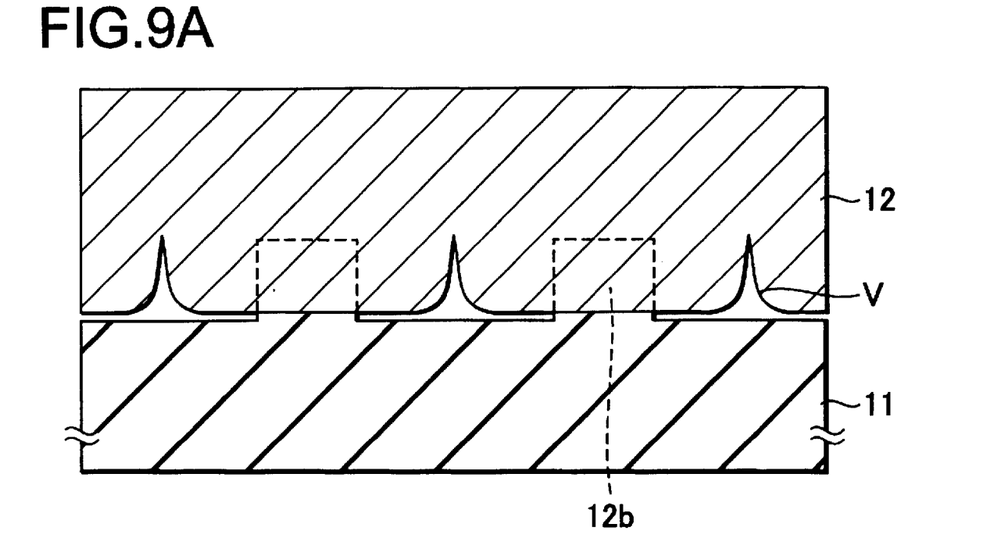
FIG. 9A is a schematic sectional view showing a semiconductor layer grown by the prior art.

By further continuing the growth of the second semiconductor layer 12, the sapphire substrate 11 having a GaN layer (first semiconductor layers 12b and second semiconductor layer 12) formed thereon is obtained as shown in FIG. 9A.

Using such GaN layer comprising the first semiconductor layers 12b and the second semiconductor layer 12 as a buffer layer, and further forming thereon through crystal growth an n-type contact layer, an n-type cladding layer, an n-type guide layer, an active layer (light emitting layer), a p-type cap layer, a p-type guide layer, a p-type cladding layer and a p-type contact layer in this order can produce a desired semiconductor light emitting element.

The GaN layer (second semiconductor layer 12) thus grown partially has a high-quality crystal area having a less amount of threading dislocation since the threading dislocation is deflected and converged during the lateral growth from the side plane of the ridge-formed GaN film (first semiconductor layer 12b). So that fabricating a light emitting portion of a light emitting element in such high-quality area allows the light emitting element to improve the light emitting property and the lifetime thereof.

A problem, however, resides in that the second semiconductor layer 12 thus obtained tends to have large voids V in areas where the portions of the second semiconductor layer 12 individually grown from the adjacent first semiconductor layers 12b fuse with each other. Such large voids V will interfere lateral current flow of an element fabricated thereon.

Another problem resides in that the c-axis may incline in thus grown second semiconductor layer 12.

The X-ray diffractometry (XRD) of such second semiconductor layer 12 shows a three-split peak, which implies a presence of a crystal area having an inclined c-axis.

A still another problem resides in that the second semiconductor layer 12 thus formed tends to have lateral defects in the vicinity of the areas where the portions of the second semiconductor layer 12 individually grown from the adjacent first semiconductor layers 12b fuse with each other.

Figure 9B:
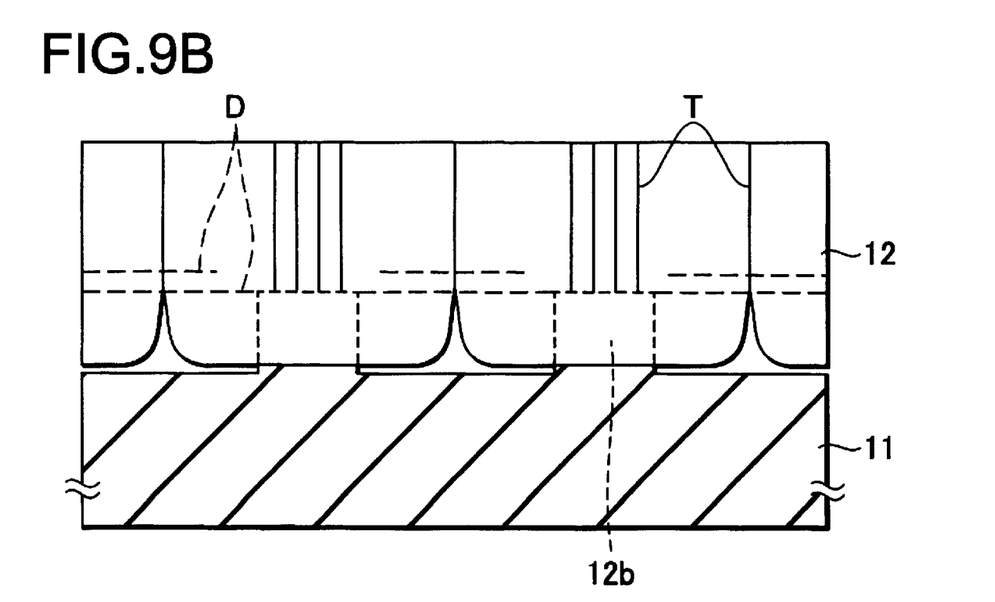
FIG. 9B is a schematic view showing defects revealed by TEM observation of the same field.

FIG. 9B is a schematic drawing illustrating an image obtained from a TEM (transmission electron microscope) observation. While threading dislocations T extend upward from the upper plane of the first semiconductor layers 12b and the location of the voids V, a lot of other defects D were found to occur in the lateral direction also in the area grown in the lateral direction (in-plane direction of the substrate) containing a less amount of such threading dislocations T.

It is therefore an object of the present invention to provide a method for growing a semiconductor layer by which the size of the generable voids is controllable, inclination of the c-axis of the semiconductor crystal is avoidable and the defects in the semiconductor layer is reducible, and as well as to provide a method for fabricating a semiconductor light emitting element using such semiconductor layer.

SUMMARY OF THE INVENTION

To accomplish the foregoing object, a method for growing a semiconductor layer of the present invention comprises for a step of forming on a substrate a first semiconductor layer made of a III–V group compound so as to have a projected form; and a step of growing in vapor phase on the surface of the first semiconductor layer a second semiconductor layer made of a III–V group compound under a condition by which a growth rate in a direction parallel to a major plane of the substrate is larger than a growth rate in a direction perpendicular thereto; wherein the step of the vapor-phase growth includes a process for growing the second semiconductor layer so that side planes thereof incline at an acute angle to a bottom plane thereof.

In such method for growing a semiconductor layer according to the present invention, the acute angle between the side planes and the bottom plane of the second semiconductor layer is preferably attained by controlling the pressure in a reaction chamber in which the vapor phase growth proceeds in the step for growing such second semiconductor layer.

In particular, it is preferable to control the pressure in a reaction chamber, in which the vapor phase growth proceeds in the step of growing such second semiconductor layer, to be 53,200 Pa (400 Torr) or above.

In such method for growing a semiconductor layer according to the present invention, it is more preferable that the step for forming the first semiconductor layer further comprises a step for forming such first semiconductor layer on the entire surface of the substrate; and a step for processing such first semiconductor layer so as to have a predetermined pattern.

More preferably, the step for processing the first semiconductor layer further comprises a step for patterning a resist film for protecting such first semiconductor layer in a portion to be remained; and a step for etching the first semiconductor layer while being masked with such resist film, wherein additional etching is proceeded after the completion of the etching of the first semiconductor layer so as to lower the surface level of the substrate, to thereby attain a surface figuration of the substrate such that being projected in an area such first semiconductor layer remains.

In such method for growing a semiconductor layer according to the present invention, it is preferable that the side planes of the second semiconductor layer inclined at an acute angle to the bottom plane thereof have a (11–22) crystal plane.

In such method for growing a semiconductor layer according to the present invention, it is preferable that the first semiconductor layer and the second semiconductor layer individually comprise a GaN layer.

According to the method for growing a semiconductor layer of the present invention, the first semiconductor layer is formed on the entire surface of the substrate, the resist film is formed on the first semiconductor layer so as to protect a portion thereof to be remained, the first semiconductor layer is etched while being masked with the resist film, the substrate is further etched to lower the surface level thereof so as to attain a surface figuration thereof such that being projected in an area where the first semiconductor layer remains, to thereby process the first semiconductor layer typically comprising GaN, one of III–V compound semiconductor, into a predetermined projected pattern on the substrate.

The second semiconductor layer typically comprising GaN, one of III–V compound semiconductor, is then formed on the first semiconductor layer under a condition by which a growth rate in the direction parallel to the major plane of the substrate is larger than a growth rate in the direction perpendicular thereto. The pressure of the reaction chamber in which the vapor phase growth proceeds is now controlled typically at 53,200 Pa (400 Torr) or above to thereby allow the (11–22) plane to appear on the side planes of the second semiconductor layer, which means that the side planes of the second semiconductor layer incline at an acute angle to the bottom plane thereof.

Since the method for growing a semiconductor layer of the present invention allows the second semiconductor layer to grow so as to keep the acute angle between the side planes and bottom plane thereof, fusion of the portions of the second semiconductor layers individually grown from the adjacent first semiconductor layers will proceed in a gradual manner from the side close to the substrate. This successfully prevents the reaction gas from being shut out over the second semiconductor layer and reduces the size of the voids generable at the site of fusion.

Since the process is also beneficial in suppressing the stress applied to the second semiconductor layer at the time of the fusion of the portions thereof individually grown from the adjacent first semiconductor layers, the inclination of the c-axis of the semiconductor crystal will be suppressed, and defects generable in the lateral direction (in-plane direction of the substrate) within such semiconductor layer will be reduced.

To accomplish the foregoing object, a method for fabricating a semiconductor light emitting element having on a substrate a semiconductor stack which comprises a first cladding layer of a first conductive type, an active layer and a second cladding layer of a second conductive type, the semiconductor stack further comprising a III–V group compound semiconductor layer formed on such substrate; a process for forming the III–V group compound semiconductor layer comprises the steps for forming on such substrate a first semiconductor layer made of a III–V group compound so as to have a projected form; and growing in vapor phase on the surface of the first semiconductor layer a second semiconductor layer made of a III–V group compound under a condition by which the growth rate in the direction parallel to the major plane of the substrate is larger than that in the direction perpendicular thereto; wherein the step of the vapor-phase growth includes a process for growing the second semiconductor layer so that the side planes thereof incline at an acute angle to the bottom plane thereof.

The method of the present invention is the one for fabricating a semiconductor light emitting element having on a substrate a semiconductor stack which comprises a first cladding layer of a first conductive type, an active layer and a second cladding layer of a second conductive type, the semiconductor stack further comprising a III–V group compound semiconductor layer formed on such substrate; where the III–V group compound semiconductor layer is obtained by forming on such substrate a first semiconductor layer made of a III–V group compound so as to have a projected form; and growing in vapor phase on the surface of the first semiconductor layer a second semiconductor layer made of a III–V group compound under a condition by which the growth rate in the direction parallel to the major plane of the substrate is larger than that in the direction perpendicular thereto, so that the side planes of the second semiconductor layer incline at an acute angle to the bottom plane thereof.

Since the method for fabricating a semiconductor light emitting element of the present invention allows the second semiconductor layer to grow so as to keep the acute angle between the side planes and bottom plane thereof when the III–V compound semiconductor layer is formed on the substrate, fusion of the second semiconductor layers individually grown from the adjacent first semiconductor layers will proceed in a gradual manner from the side close to the substrate. This successfully prevents the reaction gas from being shut out over the second semiconductor layer and reduces the size of the voids generable at the site of fusion.

Since the process is also beneficial in suppressing the stress applied to the second semiconductor layer at the time of the fusion of the portions thereof individually grown from the adjacent first semiconductor layers, the inclination of the c-axis of the semiconductor crystal will be suppressed, and defects generable in the lateral direction (in-plane direction of the substrate) within such semiconductor layer will be reduced.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIGS. 1A to 1C are schematic sectional views explaining a method for growing a semiconductor layer of the present invention, where FIG. 1A shows a state a first semiconductor layer is grown, FIG. 1B shows a state a resist film is patterned, and FIG. 1C shows a state the first semiconductor layer is patterned;

FIGS. 2A to 2C are schematic sectionals views explaining process steps as continued from FIG. 1C, where FIG. 2A shows a state the resist film is removed, FIG. 2B shows a state a second semiconductor layer is grown, and FIG. 2C shows a state the second semiconductor layer is further grown;

FIGS. 6A and 6B are schematic sectional views explaining process steps for fabricating a semiconductor light emitting element shown in FIG. 5A, where FIG. 6A shows a state a layer below the active layer is formed, and FIG. 6B shows a state the active layer is formed;

FIGS. 7A to 7C are schematic sectional views explaining a method for growing a semiconductor layer of the prior art, where FIG. 7A shows a state a first semiconductor layer is grown, FIG. 7B shows a state a resist film is patterned, and FIG. 7C shows a state the first semiconductor layer is patterned;

FIGS. 8A to 8C are schematic sectional views explaining process steps as continued from FIG. 7C, where FIG. 8A shows a state the resist film is removed, FIG. 8B shows a state a second semiconductor layer is grown, and FIG. 8C shows a state the second semiconductor layer is further grown.

DESCRIPTION OF THE PREFERRED EMBODIMENT

Embodiments of the method for growing a semiconductor layer and the method for fabricating a semiconductor light emitting element using such layer according to the present invention will be explained hereinafter referring to the attached drawings, where all drawings will have common reference numerals for the identical or corresponding portions.

First Embodiment

The method for growing a semiconductor layer according to a First Embodiment will be explained hereinafter referring to the drawings.

Figure 1A:
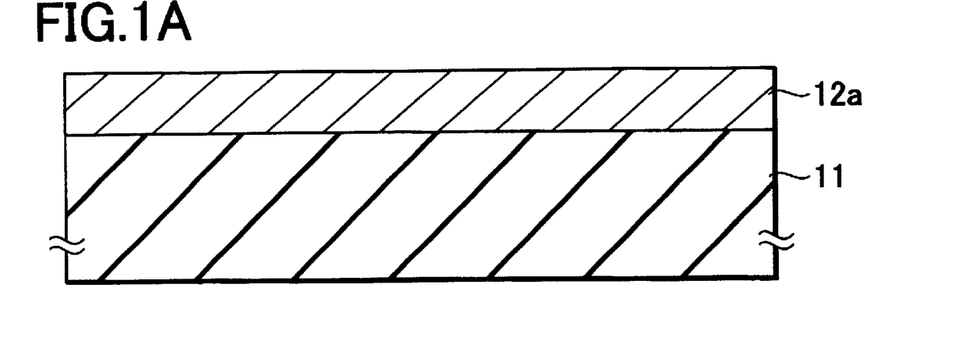

First, as shown in FIG. 1A, the c-plane of the sapphire substrate 11 is subjected to thermal cleaning, and a GaN layer of approx. 1 to 3 $\mu$m thick (typically 2 $\mu$m) is grown by the MOCVD process to thereby form a first semiconductor layer 12$a$.

Figure 1B:
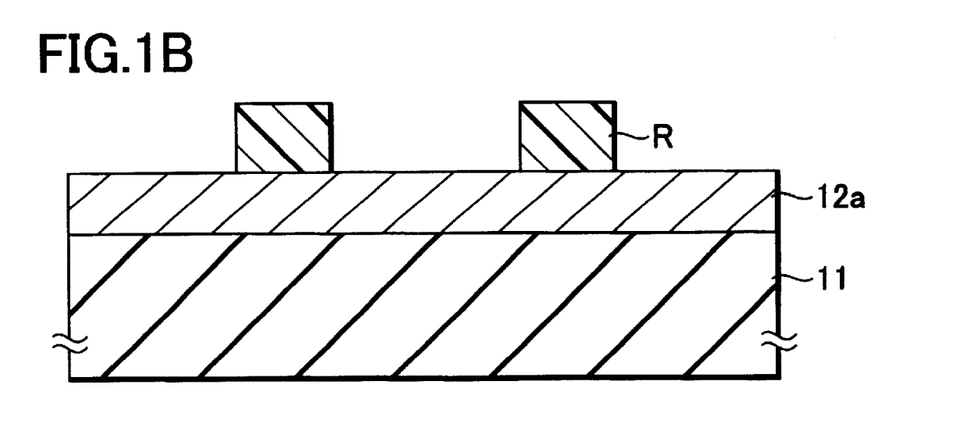

Next, a photosensitive resin is coated on the entire surface of the first semiconductor layer 12$a$, and the coated film is then patterned by photolithographic processes such as light exposure and development to thereby form a resist film R on the first semiconductor layer 12$a$ for protecting thereof selectively in a region to be remained, as shown in FIG. 1B.

Figure 1C:
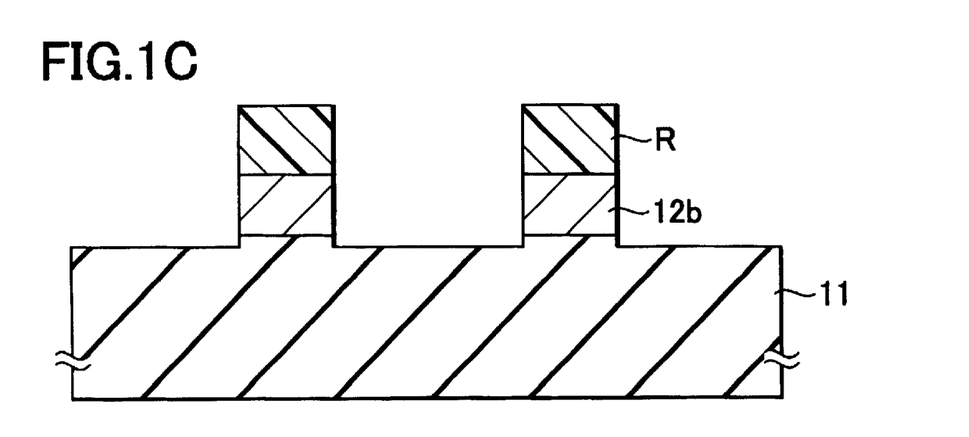

Next, as shown in FIG. 1C, the first semiconductor layer 12$a$ is etched while being masked with the resist film R, to thereby form first semiconductor layers 12$b$ projected in a ridge form on the sapphire substrate 11.

Each first semiconductor layer 12$b$ is 1 to 3 $\mu$m high and 3 $\mu$m wide, and such ridge-formed first semiconductor layers 12$b$ are repetitively formed over the entire surface of the sapphire substrate 11 with 10-$\mu$m intervals.

Thereafter the etching is further proceeded to lower the surface level of the sapphire substrate 11 so that such sapphire substrate 11 will be projected in portions where the first semiconductor layers 12$b$ are formed.

Figure 2A:
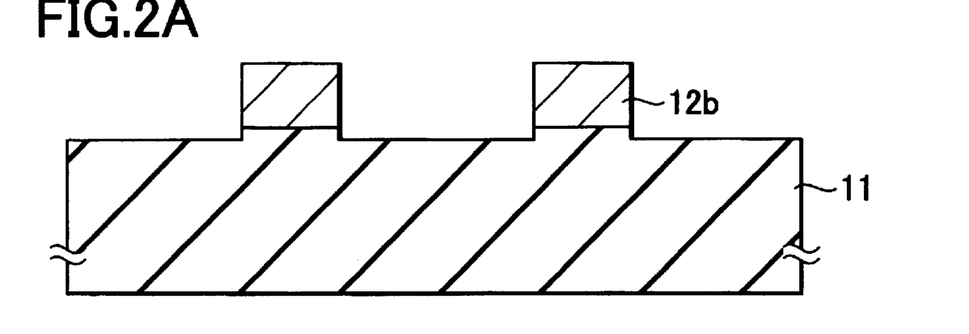
Figure 2B:
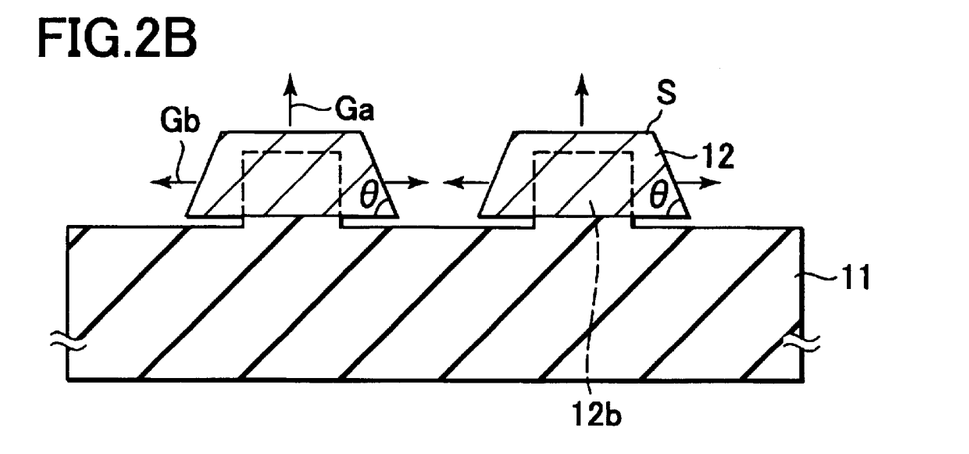

Next, the resist film R is removed typically by ashing as shown in FIG. 2A, and on the surface of the first semiconductor layers 12$b$ a second semiconductor layer 12 again comprising GaN similarly to the first semiconductor layer 12$b$ is grown in vapor phase under a condition by which the growth rate $G_b$ in the direction parallel to the major plane of the sapphire substrate 11 is larger than that $G_a$ in the direction perpendicular thereto.

In such process, the pressure in a reaction chamber in which the vapor phase growth proceeds is controlled at 53,200 Pa (400 Torr) or around (typically at 93,100 Pa (700 Torr)). Such control allows a (11–22) plane to appear on the side plane S of the second semiconductor layer 12, which inclines at an acute angle $\theta$ to the bottom plane thereof.

While factors other than the pressure in the reaction chamber may affect the appearance of the side planes S which inclines at an acute angle $\theta$ to the bottom plane, a pressure lower than 53,200 Pa (400 Torr) substantially inhibits the appearance of such side planes S, so that the pressure of 53,200 Pa (400 Torr) or above is preferable.

Figure 2C:
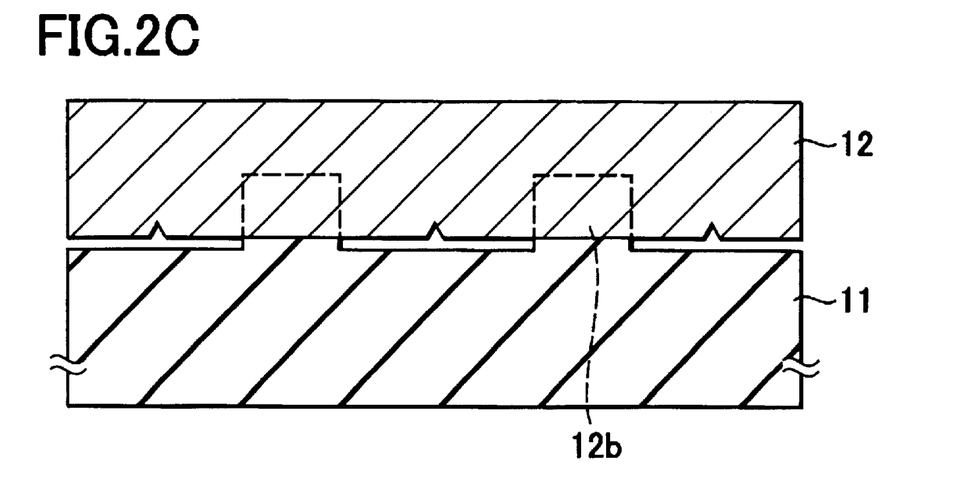

Continuing such vapor-phase growth of the second semiconductor layer 12 will result in fusion of the portions of the second semiconductor layer 12 individually grown from the surface of the adjacent first semiconductor layers 12$b$, and thereafter only the growth in the direction perpendicular to the major plane of the sapphire substrate 11 will continue, as shown in FIG. 2C.

Figure 3A:
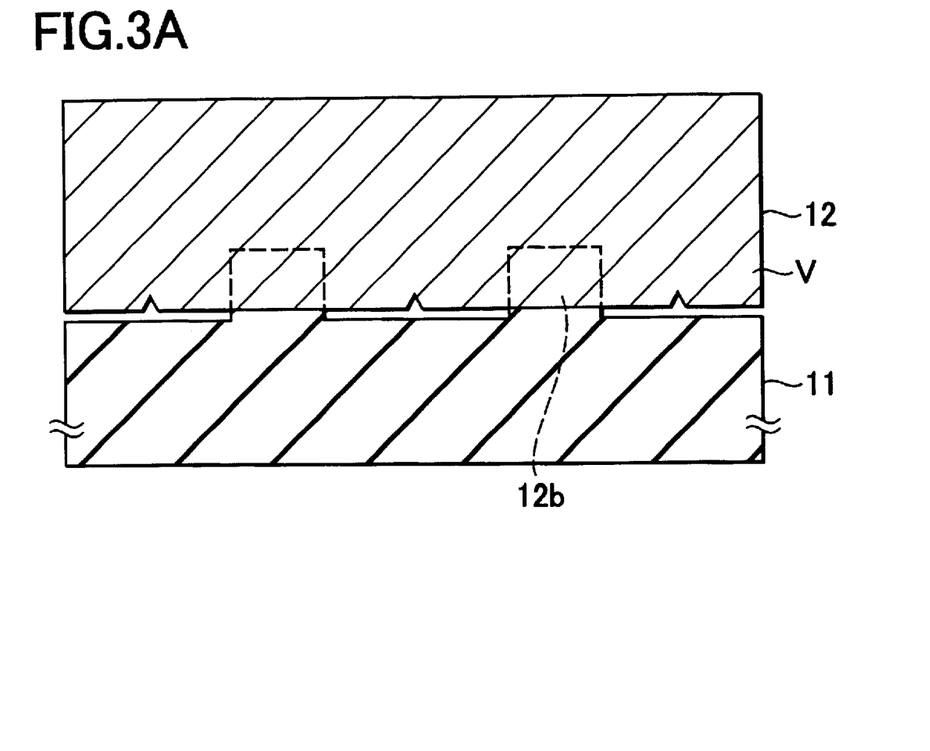
FIG. 3A is a schematic sectional view showing a semiconductor layer grown by the method of the present invention.

By further continuing the growth of the second semiconductor layer 12, the sapphire substrate 11 having a GaN layer (first semiconductor layers 12b and second semiconductor layer 12) formed thereon is obtained as shown in FIG. 3A.

Using such GaN layer comprising the first semiconductor layers 12b and the second semiconductor layer 12 as a buffer layer, and further forming thereon through crystal growth an n-type contact layer, an n-type cladding layer, an n-type guide layer, an active layer (light emitting layer), a p-type cap layer, a p-type guide layer, a p-type cladding layer and a p-type contact layer in this order can produce a desired semiconductor light emitting element.

The GaN layer (second semiconductor layer 12) thus grown partially has a high-quality crystal area having a less amount of threading dislocation since the threading dislocation is deflected and converged during the lateral growth from the side plane of the ridge-formed GaN film (first semiconductor layer 12b). So that fabricating a light emitting portion of a light emitting element in such high-quality area allows the light emitting element to improve the light emitting property and the lifetime thereof.

Since the method for growing a semiconductor layer of the First Embodiment allows the second semiconductor layer to grow so as to keep the acute angle between the side planes and bottom plane thereof, fusion of the portions of the second semiconductor layers individually grown from the adjacent first semiconductor layers will proceed in a gradual manner from the side close to the substrate. This successfully prevents the reaction gas from being shut out over the second semiconductor layer and reduces the size of the voids V generable at the site of fusion.

Since the process is also beneficial in suppressing the stress applied to the second semiconductor layer at the time of the fusion of the portions thereof individually grown from the adjacent first semiconductor layers, the inclination of the c-axis of the semiconductor crystal will be suppressed, and defects generable in the lateral direction (in-plane direction of the substrate) within such semiconductor layer will be reduced.

EXAMPLE 1

Figure 3B:
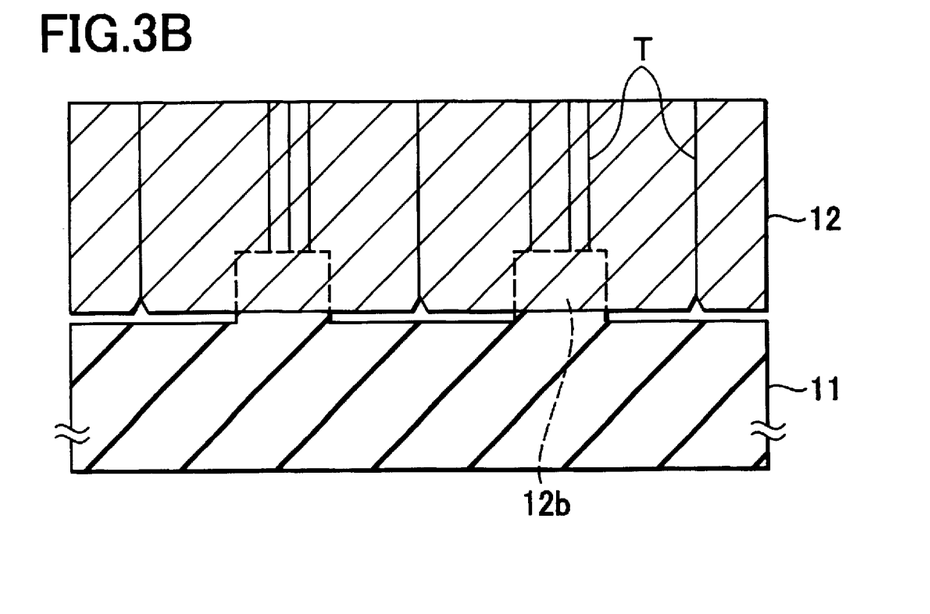
FIG. 3B is a schematic view showing defects revealed by TEM observation of the same field.

FIG. 3B is a schematic view showing defects revealed by a TEM observation of the semiconductor layer grown according to the First Embodiment, where the illustrated range corresponds with that for the semiconductor layer shown in FIG. 3A. The threading dislocations T extend upward from the upper surface of the first semiconductor layers 12b and the portions of the voids V.

There was, however, no observation of the lateral defect extending in the lateral direction within the area grown in the lateral direction (in-plane direction of the substrate) having a less amount of threading dislocation, which have been observed in the prior art as shown in FIG. 9B.

EXAMPLE 2

An X-ray diffractometry (XRD) of the semiconductor layer grown according to the First Embodiment revealed that the peak has no split, although having been observed in the prior art, and appears as a single peak, which demonstrates that the inclination of the c-axis of the crystal did not occur.

Second Embodiment

FIG. 4 is a perspective view showing a GaN-base semiconductor light emitting element (laser diode LD) as an embodiment of a nitride-base III–V compound semiconductor light emitting element according to Second Embodiment.

In such constitution, a GaN-base semiconductor layer including an active layer 16 based on a multiple quantum well structure is stacked on the sapphire substrate 11, to thereby form a semiconductor stack 10.

In the semiconductor stack 10, the active layer 16 is interposed between a p-type cladding layer and an n-type cladding layer on which a p-electrode 10a and an n-electrode 10b are formed, respectively. Since the sapphire substrate 11 is an insulating material, a semiconductor layer which is connected to the n-type cladding layer or an extended portion 10c of such n-type cladding layer per se is formed on the sapphire substrate 11 so as to projected out from the semiconductor stack 10, and further thereon the n-electrode 10b is formed.

When a predetermined voltage is applied from a power source B between such p-electrode 10a and the n-electrode 10b, the active layer 16 within the semiconductor stack 10 emits laser light L.

FIG. 5A is a sectional view showing in more detail a portion of the foregoing semiconductor stack 10.

In such constitution, a buffer layer 12 typically made of GaN is formed on the sapphire substrate 11, and further thereon an n-type GaN layer (contact layer) 13 of approx. 5.0 μm thick, an n-type AlGaN layer (cladding layer) 14 of approx. 0.5 μm thick, an n-type GaN layer (guide layer) 15 of approx. 0.1 μm thick, the active layer (light emitting layer) 16 having a multiple quantum well (MQW) structure typically made of GaInN, a p-type AlGaN layer (cap layer) 17 of approx. 0.02 μm, a p-type GaN layer (guide layer) 18 of approx. 0.1 μm thick, a p-type AlGaN layer (cladding layer) 19 of approx 0.5 μm thick, and a p-type GaN layer (contact layer) 20 of approx. 0.1 μm thick are stacked in this order.

As for the layers described in the above, an n-type impurity (donor impurity) to be doped into the n-type layers can be silicon (Si) or the like, and a p-type impurity (acceptor impurity) to be doped into the p-type layers can be magnesium (Mg), zinc (Zn) or the like.

FIG. 5B is a schematic view showing a potential profile of the active layer 16 having a multiple quantum well structure.

Such quantum well structure is attained by a constitution of the active layer 16 in which layers individually having an indium (In) content of 2% and 8%, which differ in the potential, are alternatively stacked with each other.

A method for growing the multiple GaN-base semiconductor layers whose constitution is shown in FIG. 5A will be explained referring to FIGS. 6A and 6B.

As shown in FIG. 6A, the sapphire substrate 11 having the c-plane exposed on the surface thereof is subjected to thermal cleaning, and further thereon the buffer layer 12 typically made of GaN if formed by the MOCVD process. The formation of the buffer layer 12 is now proceeded according to the method for growing a semiconductor layer according to First Embodiment capable of producing a high-quality crystal area having a less amount of threading dislocation, by which the size of the generable voids is controllable, inclination of the c-axis of the semiconductor crystal is avoidable and the defects in the semiconductor layer is reducible.

That is, the first semiconductor layer 12a is formed on the c-plane of the sapphire substrate 11, and then etched while being masked with the resist film R patterned thereon, to thereby form a first semiconductor layers 12b projected in a ridge form on the sapphire substrate 11. The resist film R is removed, and on the surface of the first semiconductor layers 12b a second semiconductor layer 12 again comprising GaN similarly to the first semiconductor layers 12b is grown in vapor phase under a condition by which the growth rate $G_b$ in the direction parallel to the major plane of the sapphire substrate 11 is larger than the growth rate $G_a$ in the direction perpendicular thereto. This allows a (11–22) plane to appear on the side planes S of the second semiconductor layer 12 serves as the buffer layer 12, which inclines at an acute angle θ to the bottom plane thereof.

Next, on the buffer layer 12, the n-type GaN layer (contact layer) 13 of approx. 5.0 μm thick, the n-type AlGaN layer (cladding layer) 14 of approx. 0.5 μm thick and the n-type GaN layer (guide layer) 15 of approx. 0.1 μm thick are stacked by crystal growth in this order.

An n-type impurity (donor impurity) used for the doping into the foregoing n-type layers in the above process is represented by silicon (Si).

Next, as shown in FIG. 6B, the active layer (light emitting layer) 16 having a multiple quantum well (MQW) structure made of GaInN is formed through crystal growth by the MOCVD process on the n-type GaN layer 15.

The p-type AlGaN layer (cap layer) 17 of approx. 0.02 μm, the p-type GaN layer (guide layer) 18 of approx. 0.1 μm thick, the p-type AlGaN layer (cladding layer) 19 of approx. 0.5 μm thick, and the p-type GaN layer (contact layer) 20 of approx. 0.1 μm thick are then formed on the active layer 16 in this order through crystal growth by the MOCVD process, to thereby obtain a structure shown in FIG. 5A.

The p-Type impurities (acceptor impurity) available for the doping into the foregoing p-type layers in the above process include magnesium (Mg) and zinc (Zn).

In the successive process steps, the extended portion 10c of the n-type cladding layer as shown in FIG. 4 is formed by etching, electrodes 10a, 10b are formed, and end planes for allowing laser oscillation are formed for example by etching, to thereby obtain a desired laser diode.

The method for fabricating a semiconductor light emitting element of the Second Embodiment allows the second semiconductor layer to grow so as to keep the acute angle between the side planes and bottom plane thereof when the III–V compound semiconductor layer is formed, so that the fusion of the portions of the second semiconductor layer individually grown from the adjacent first semiconductor layers will proceed in a gradual manner from the side close to the substrate. This successfully prevents the reaction gas from being shut out over the second semiconductor layer and reduces the size of the voids generable at the site of fusion.

Since the process is also beneficial in suppressing the stress applied to the second semiconductor layer at the time of the fusion of the portions thereof individually grown from the adjacent first semiconductor layer, the inclination of the c-axis of the semiconductor crystal will be suppressed, and defects generable in the lateral direction (in-plane direction of the substrate) within such semiconductor layer will be reduced.

A laser coupler intended for use in an optical pick-up device for an optical disk drive is an example which can preferably be composed with such laser diode according to Second Embodiment.

While the present invention has been described referring to the preferable Embodiments, the present invention is by no means limited thereto.

For example, the method for growing a semiconductor layer is applicable not only to growth of a GaN layer on a GaN substrate, but also to growth of other III–V compound semiconductor layer on other III–V compound semiconductor substrate.

The emission wavelength of the laser diode of the present invention or other light emitting element is not specifically limited, and can be selected at a wavelength that adopted by DVD or other next-generation optical disk system.

While the above Embodiment dealt with a laser diode, the present invention is not limitative thereto and is also applicable to an LED (light emitting diode).

The method for fabricating a semiconductor light emitting element of the present invention also allows the fabrication of a semiconductor light emitting device having a plurality of light emitting elements composed in a monolithic manner. In such case, the light emitting device can be composed of a plurality of light emitting elements differ in the emission wavelength, those differ in the emission intensity at the same emission wavelength, or those identical in the element properties.

While the above Embodiment did not detail a current confinement structure of the laser diode, the present invention is also applicable to a variety of laser devices of the gain guide type, the index guide type, or the pulsation type.

It is to be understood that any modifications will be accepted without departing from the spirit and scope of the present invention.

What is claimed is:

1. A method for growing a semiconductor layer comprising the steps of:
   forming on a substrate a first semiconductor layer made of a III–V group compound so as to have a projected form; and
   growing in vapor phase on a surface of said first semiconductor layer a second semiconductor layer made of a III–V group compound under a condition by which a growth rate in a direction parallel to a major plane of said substrate is larger than a growth rate in a direction perpendicular thereto; wherein
   said step of the vapor-phase growth includes a process for growing the second semiconductor layer so that side planes thereof incline at an acute angle to a bottom plane thereof.

2. The method for growing a semiconductor layer as claimed in claim 1, wherein said acute angle between the side planes and the bottom plane of said second semiconductor layer is attained by controlling a pressure in a reaction chamber in which the vapor phase growth proceeds in the step for growing such second semiconductor layer.

3. The method for growing a semiconductor layer as claimed in claim 2, wherein said pressure in the reaction chamber is controlled to be 53,200 Pa or above.

4. The method for growing a semiconductor layer as claimed in claim 1, wherein said step for forming said first semiconductor layer further comprises a step for forming such first semiconductor layer on an entire surface of said substrate; and a step for processing such first semiconductor layer so as to have a predetermined pattern.

5. The method for growing a semiconductor layer as claimed in claim 4, wherein:
   said step for processing said first semiconductor layer further comprises a step for patterning a resist film for protecting such first semiconductor layer in a portion to be remained; and a step for etching said first semiconductor layer while being masked with such resist film; and
   additional etching is proceeded after the completion of said etching of said first semiconductor layer so as to lower a surface level of said substrate, to thereby attain a surface figuration of the substrate such that being projected in an area such first semiconductor layer remains.

6. The method for growing a semiconductor layer as claimed in claim 1, wherein said side planes of said second semiconductor layer inclined at an acute angle to the bottom plane thereof have a (11–22) crystal plane.

7. The method for growing a semiconductor layer as claimed in claim 1, wherein said first semiconductor layer and said second semiconductor layer individually comprise a GaN layer.

8. A method for fabricating a semiconductor light emitting element having on a substrate a semiconductor stack which comprises a first cladding layer of a first conduction type, an active layer and a second cladding layer of a second conduction type, said semiconductor stack further comprising a III–V group compound semiconductor layer formed on said substrate; a process for forming said III–V group compound semiconductor layer comprises the steps for:

forming on said substrate a first semiconductor layer made of a III–V group compound so as to have a projected form; and growing in vapor phase on a surface of said first semiconductor layer a second semiconductor layer made of a III–V group compound under a condition by which a growth rate in a direction parallel to a major plane of said substrate is larger than a growth rate in a direction perpendicular thereto, wherein said step of the vapor-phase growth includes a process for growing the second semiconductor layer so that side planes thereof incline at an acute angle to a bottom plane thereof.

* * * * *